(12) United States Patent
Rhodes

(10) Patent No.: US 6,414,342 B1
(45) Date of Patent: Jul. 2, 2002

(54) PHOTOGATE WITH IMPROVED SHORT WAVELENGTH RESPONSE FOR A CMOS IMAGER

(75) Inventor: Howard E. Rhodes, Boise, ID (US)

(73) Assignee: Micron Technology Inc., Boise, ID (US)

(*) Notice: Subject to any disclaimer, the term of this patent is extended or adjusted under 35 U.S.C. 154(b) by 0 days.

(21) Appl. No.: 09/335,875

(22) Filed: Jun. 18, 1999

(51) Int. Cl.$^7$ .............................................. H01L 31/062
(52) U.S. Cl. ...................................... 257/291; 257/249
(58) Field of Search ................................. 257/249, 291, 257/292

(56) References Cited

U.S. PATENT DOCUMENTS

| 4,051,374 A | | 9/1977 | Drexhage et al. |
|---|---|---|---|
| 4,066,455 A | | 1/1978 | Mey et al. |
| 4,143,389 A | * | 3/1979 | Koike et al. ................ 257/292 |
| 4,262,297 A | | 4/1981 | Partridge |
| 4,309,624 A | | 1/1982 | Hynecek et al. |
| 4,319,261 A | | 3/1982 | Kub |
| 4,374,700 A | | 2/1983 | Scott et al. |
| 4,450,465 A | * | 5/1984 | Pimbley et al. ............. 257/291 |
| 4,605,849 A | | 8/1986 | Kliem et al. |
| 4,695,860 A | * | 9/1987 | Blanchard et al. .......... 257/249 |
| 4,700,459 A | | 10/1987 | Peek |
| 4,910,570 A | | 3/1990 | Popovic |
| 4,968,634 A | | 11/1990 | Kuhlmann |
| 5,151,385 A | | 9/1992 | Yamamoto et al. |
| 5,319,604 A | | 6/1994 | Imondi et al. |
| 5,358,755 A | | 10/1994 | Li et al. |
| 5,393,997 A | | 2/1995 | Fukusho et al. |
| 5,461,425 A | | 10/1995 | Fowler et al. |
| 5,471,515 A | | 11/1995 | Fossum et al. |
| 5,506,429 A | | 4/1996 | Tanaka et al. |
| 5,541,402 A | | 7/1996 | Ackland et al. |
| 5,576,763 A | | 11/1996 | Ackland et al. |
| 5,608,243 A | | 3/1997 | Chi et al. |
| 5,612,799 A | | 3/1997 | Yamazaki et al. |
| 5,614,744 A | | 3/1997 | Merrill |
| 5,625,210 A | | 4/1997 | Lee et al. |
| 5,705,846 A | | 1/1998 | Merrill |
| 5,708,263 A | | 1/1998 | Wong |
| 5,747,840 A | | 5/1998 | Merrill |
| 5,757,045 A | | 5/1998 | Tsai et al. |
| 5,760,458 A | | 6/1998 | Bergemont et al. |
| 5,841,159 A | * | 11/1998 | Lee et al. .................... 257/291 |
| 6,021,172 A | * | 2/2000 | Fossum et al. ............. 257/292 |

OTHER PUBLICATIONS

Dickinson, A., et al., A 256×256 CMOS Active Pixel Image Sensor with Motion Detection, 1995 IEEE International Solid–State Circuits Conference, pp. 226–227.

Dickinson, A., et al., Standard CMOS Active Pixel Image Sensors for Multimedia Applications, Proceedings of Sixteenth Conference on Advanced Research in VLSI, Mar. 27–29, 1995, pp. 214–224.

Eid, E–S., et al., A 256×256 CMOS Active Pixel Image Sensor, Proc. SPIE vol. 2415, Apr. 1995, pp. 265–275.

Fossum, E., CMOS Image Sensors: Electronic Camera On A Chip, 1995 IEEE, pp. 17–25.

(List continued on next page.)

Primary Examiner—Gene M. Munson
(74) Attorney, Agent, or Firm—Dickstein Shapiro Morin & Oshinsky LLP

(57) ABSTRACT

A photogate-based photosensor for use in a CMOS imager exhibiting improved short wavelength light response. The photogate is formed of a thin conductive layer about 50 to 3000 Angstroms thick. The conductive layer may be a silicon layer, a layer of indium and/or tin oxide, or may be a stack having an indium and/or tin oxide layer over a silicon layer. The thin conductive layer of the photogate permits a greater amount of short wavelength light to pass through the photogate to reach the photosite in the substrate, and thereby increases the quantum efficiency of the photosensor for short wavelengths of light.

20 Claims, 10 Drawing Sheets

OTHER PUBLICATIONS

Fossum, E., et al., IEDM A 37×28mm$^2$600k–Pixel CMOS APS Dental–X–Ray Camera–on–a–Chip with Self–Triggered Readout, 1998 IEEE International Solid–State Circuits Conference, pp. 172–173.

Fossum, E., Low Power Camera–on–a–Chip Using CMOS Active Pixel Sensor Technology, 1995 IEEE, pp. 74–77.

Fossum, E., Architectures for focal plane image processing, Optical Engineering, vol. 28, No. 8, Aug. 1989, pp. 865–871.

Janesick, J., et al., New advancements in charge–coupled device technology—sub–electron noise and 4096×4096 pixel CCDs, Proc. SPIE vol. 1242, 1990, pp. 223–237.

Kemeny, S.E., et al., Update on focal–plane image processing research, Proc. SPIE vol. 1447, 1991, pp. 243–250.

Mendis, S., et al., CMOS Active Pixel Image Sensor, IEEE Transactions on Electron Devices, vol. 41, No. 3, Mar. 1994, pp. 452–453.

Mendis S.K., et al., A 128 × 128 CMOS Active Pixel Image Sensor for Highly Integrated Imaging Systems, 1993 IEEE, pp. 583–586.

Mendis, S.K. et al., CMOS Active Pixel Image Sensors for Highly Integrated Imaging Systems, IEEE Journal of Solid–State Circuits, vol. 32, No. 2, Feb. 1997, pp. 187–197.

Mendis, S.K., et al., Design of a Low–Light–Level Image Sensor with On–Chip Sigma–Delta Analog–to–Digital Conversion, Proc. SPIE vol. 1900, Jul. 1993, pp. 31–39.

Mendis, S.K., et al., Low–Light–Level Image Sensor with On–Chip Signal Processing, Proc. SPIE vol. 1952, Nov. 1993, pp. 23–33.

Mendis, S.K., et al., Progress In CMOS Active Pixel Image Sensors, Proc. SPIE vol. 2172, May 1994, pp. 19–29.

Nakamura, J., et al., CMOS Active Pixel Image Sensor with Simple Floating Gate Pixels, IEEE Transactions on Electron Devices, vol. 42, No. 9, Sep. 1995, pp. 1693–1694.

Nixon, R.H., et al., 256 × 256 CMOS Active Pixel Sensor Camera–on–a–Chip, IEEE Journal of Solid–State Circuits, vol. 31, No. 12, Dec. 1996, pp. 2046–2050.

Nixon, R.H., et al., 256×256 CMOS Active Pixel Sensor Camera–on–a–Chip, 1996 IEEE International Solid–State Circuits Conference, pp. 178–179.

Panicacci, R., et al., Programmable multirresolution CMOS active pixel sensor, Proc. SPIE vol. 2654, Mar. 1996, pp. 72–79.

Panicacci, R.A., et al., 128Mbs / s Multiport CMOS Binary Active–Pixel Image Sensor, 1996 IEEE International Solid–State Circuit Conference, pp. 100–101.

Yadid–Pecht, O., et al., CMOS Active Pixel Sensor Star Tracker with Regional Electronic Shutter, IEEE Journal of Solid–State Circuits, vol. 32, No. 2, Feb. 1997, pp. 285–288.

Yadid–Pecht, O., et al., Wide dynamic range APS star tracker, Proc. SPIE vol. 2654, Mar. 1996, pp. 82–92.

Zarnowski, J., et al., Imaging options expand with CMOS technology, Laser Focus World, Jun. 1997, pp. 125–130.

Zhou, Z., et al., A CMOS Imager with On–Chip Variable Resolution for Light–Adaptive Imaging, 1998 IEEE International Solid–State Circuits Conference, pp. 174–175.

Zhou, Z., et al., A Digital CMOS Active Pixel Image Sensor For Multimedia Applications, Proc. SPEI vol. 2894, Sep. 1996, pp. 282–288.

* cited by examiner

PHOTOGATE WITH IMPROVED SHORT WAVELENGTH RESPONSE FOR A CMOS IMAGER

FIELD OF THE INVENTION

The present invention relates generally to CMOS imagers and in particular to a CMOS imager having improved responsiveness to short wavelengths of light.

BACKGROUND OF THE INVENTION

There are a number of different types of semiconductor-based imagers, including charge coupled devices (CCDs), photodiode arrays, charge injection devices and hybrid focal plane arrays. CCD technology is often employed for image acquisition and enjoys a number of advantages which makes it the incumbent technology, particularly for small size imaging applications. CCDs are capable of large formats with small pixel size and they employ low noise charge domain processing techniques.

However, CCD imagers also suffer from a number of disadvantages. For example, they are susceptible to radiation damage, they exhibit destructive read-out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there have been some attempts to integrate on-chip signal processing with CCD arrays, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel which results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD because standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate or photoconductor. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046–2050 (1996); Mendis et al., "CMOS Active Pixel Image Sensors," IEEE Transactions on Electron Devices, Vol. 41(3), pp. 452–453 (1994), as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, or GaAs. Typically the entire substrate 16 is p-type doped silicon substrate and may contain a surface p-well 20 (with layer 18 omitted), but many other options are possible, such as, for example p on p– substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below.

A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source $V_{DD}$, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source $V_{DD}$ and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source $V_{SS}$, e.g. 0 volts. Transistor 39 is kept on by a signal $V_{LN}$ applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage $V_{SS}$. The upper side of the capacitor 64 is also connected to the gate of a p-channel output transistor 66. The drain of the output transistor 66 is connected through a column select transistor 68 to a signal sample output node $V_{OUTS}$ and through a load transistor 70 to the voltage supply $V_{DD}$. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage $V_{SS}$. The upper side of the capacitor 74 is also connected to the gate of a p-channel output transistor 76. The drain of the output transistor 76 is connected through a p-channel column select transistor 78 to a reset sample output node $V_{OUTR}$ and through a load transistor 80 to the supply voltage $V_{DD}$. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages $V_{OUTR}$ and $V_{OUTS}$ of the readout circuit 60. These voltages are then subtracted ($V_{OUTS}-V_{OUTR}$) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. FIG. 4 shows a 2×2 portion of pixel array 200. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row-lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and pulsed from 5V to 0V during integration. The reset signal RST is nominally set at 2.5V. As can be seen from the figure, the process is begun at time to by briefly pulsing reset voltage RST to 5V. The RST voltage, which is applied to the gate 32 of reset transistor 31, causes transistor 31 to turn on and the floating diffusion node 30 to charge to the $V_{DD}$ voltage present at n+ region 34 (less the voltage drop $V_{TH}$ of transistor 31). This resets the floating diffusion node 30 to a predetermined voltage ($V_{DD}-V_{TH}$). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26.

A transfer gate voltage TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 (1994); Mendis et al., "CMOS Active Pixel Image Sensors for Highly Integrated Imaging Systems," IEEE Journal of Solid State Circuits, Vol. 32(2) (1997); and Eric R. Fossum, "CMOS Image Sensors: Electronic Camera on a Chip," IEDM Vol. 95, pp. 17–25 (1995) as well as other publications. These references are incorporated herein by reference.

Photogate photosensors are preferred over photodiodes for some APS imager applications because of their high charge capacity and their ability to achieve charge-to-voltage amplification when combined with a transfer gate. A disadvantage of conventional photogates, however, is poor quantum efficiency for short wavelength light, i.e., wavelengths less than 500 nm, such as green, blue, or violet light. Polysilicon, which is typically used for the photogate, is transparent to long wavelength visible light, but attenuates short wavelength light, and is almost opaque to violet light. For example, red light (~700 nm λ) will penetrate approximately 3,000 nm into room temperature polysilicon, while violet light (~400 nm λ) will only penetrate 50 nm.

Most prior art methods to solve the poor short wavelength efficiency of imagers have utilized photodiodes, and relatively few methods have been proposed for photogate-based imagers. U.S. Pat. No. 4,051,374 teaches the use of a thin luminescent layer over an imaging device to convert short wavelength light to longer wavelengths in the yellow-orange range. The luminescent layer makes up for the imaging device's poor sensitivity in the blue range by converting light into wavelengths for which the imager has a greater sensitivity. U.S. Pat. No. 4,066,455 teaches a method of using a selenium conductive layer with a highly doped charge-generation layer. These methods add complexity to the manufacturing process of the imager, however, and have not succeeded in making photogates competitive with photodiodes when increased short wavelength sensitivity is desired.

There is needed, therefore, a pixel photosensor for use in an imager that exhibits improved short wavelength light response and quantum efficiency. A simple method of fabricating a pixel photosensor with improved short wavelength light response is also needed.

SUMMARY OF THE INVENTION

The present invention provides a photogate with improved short wavelength light response. A gate oxide is formed over a doped semiconductor substrate and a gate conductor is formed on top of the gate oxide. The gate conductor has a thickness within the range of approximately 50 to 1500 Angstroms, and is preferably approximately 50 to 800 Angstroms thick. Also provided is a stacked photogate having two layers: an upper transparent conductive layer formed of indium tin oxide, indium oxide, tin oxide, or other material, and a lower silicon layer with a thickness of approximately 50 to 800 Angstroms. Also provided is a photogate comprising a thin transparent conductive layer, approximately 100 to 3000 Angstroms thick, formed of indium tin oxide, indium oxide, tin oxide, or other material. The very thin photogate permits a greater amount of short wavelength light to pass through the photogate to reach the photosite in the substrate, and thereby increases the quantum efficiency of the photosensor.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The term "short wavelength light" is used as a generic term to refer to electromagnetic radiation having a wavelength within the range of approximately 385 to 550 nm, which includes green-blue, blue, indigo, and violet light. The following detailed description is, therefore, not to be taken in a limiting sense, and the scope of the present invention is defined by the appended claims.

Figure 5:
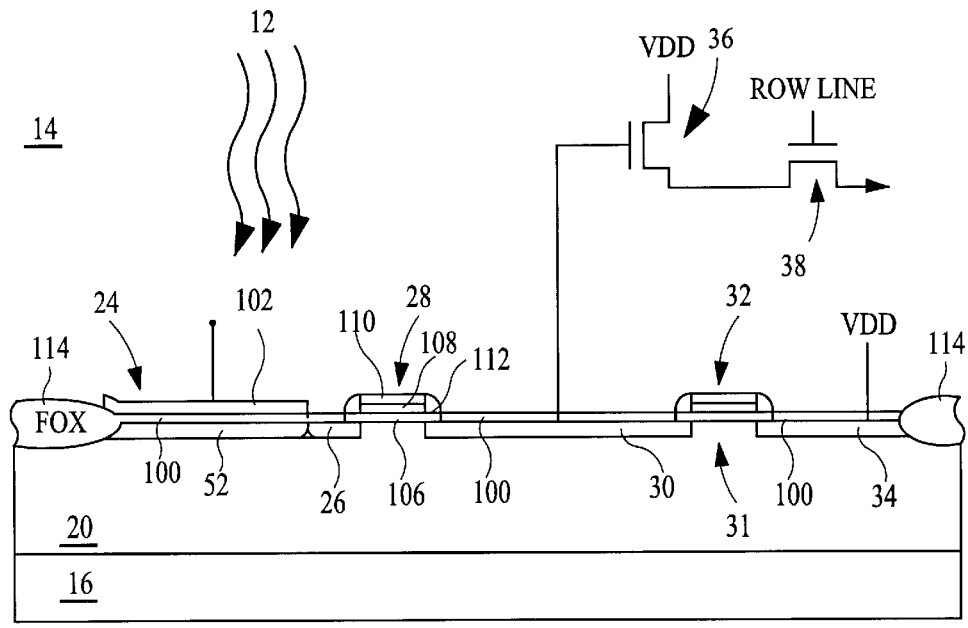
FIG. 5 is a cross-sectional diagram showing a pixel sensor according to one embodiment of the present invention.
Figure 6:
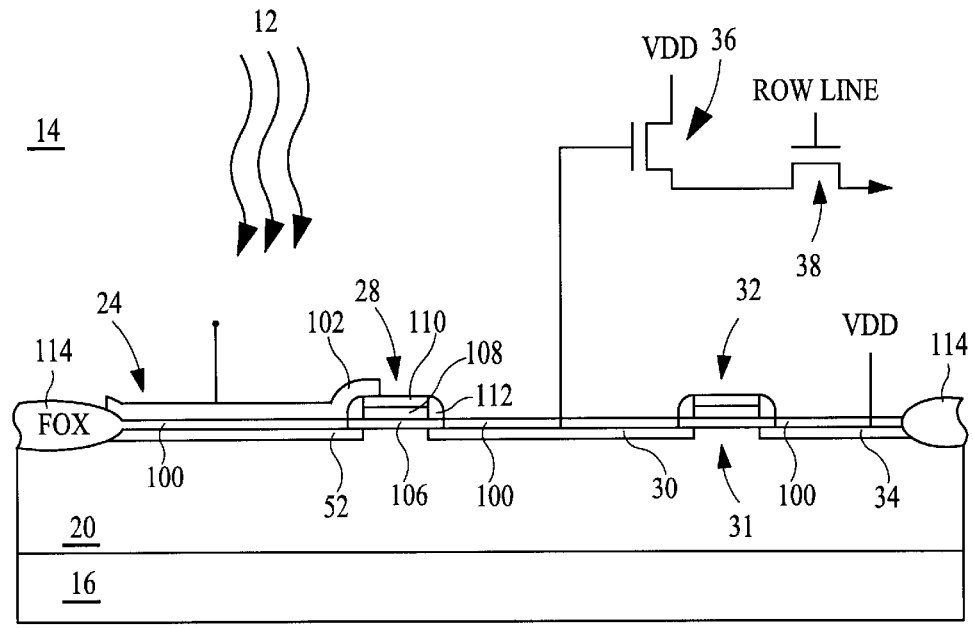
FIG. 6 is a cross-sectional diagram showing an alternate structure for the pixel sensor of FIG. 5.

The structure of the pixel cell 14 of the first embodiment is shown in more detail in FIGS. 5 and 6. The pixel 14 may be formed in a substrate 16 having a doped layer or well 20 of a first conductivity type, which for exemplary purposes is treated as p-type. The doped layer 20 is provided with four doped regions 52, 26, 30, 34 formed therein, which are doped to a second conductivity type, which for exemplary purposes is treated as n-type. The first doped region 52 underlies the photogate 24, which comprises a thin layer 102 of doped silicon material transparent to radiant energy 12, such as doped polysilicon. The thin layer 102 is approximately 50 to 1500 Angstroms thick, and preferably has a thickness within the range of 50 to 800 Angstroms, and most preferably is 300 Angstroms thick.

A gate oxide layer 100 of silicon dioxide is formed between the thin layer 102 and the doped layer 20. Insulating sidewalls 112 of silicon dioxide (oxide), silicon nitride (nitride), silicon oxynitride, ON (oxide-nitride), NO (nitride-oxide), or ONO (oxide-nitride-oxide) are formed on the sides of the transistors 28, 32. The second doped region 26 is the connecting diffusion 26 between the photogate 24 and the transfer gate 28. The third doped region 30 is the floating diffusion region, sometimes also referred to as a floating diffusion node, and it serves as the source for the reset transistor 31. The fourth doped region 34 is the drain of the reset transistor 31, and is also connected to voltage source Vdd.

The transfer gate 28 and the reset gate 32 in this first embodiment are shown to be multi-layered stacked gate structures consisting of: (1) a gate oxide layer 106, (2) a gate conductor 108 which may be doped polysilicon, or advantageously, a doped polysilicon and silicide dual layer, or a doped polysilicon and a barrier layer, such as titanium nitride, tungsten nitride, or tantalum nitride with a more conductive layer such as tungsten, molybdenum, or tantalum, and (3) may have overlying, insulating layer 110 which consists of oxide, nitride, oxynitride, ON, NO, or ONO. In all CMOS imagers there are additional transistors, including the source follower transistor and the row select transistors, that are, for simplicity, not shown in FIGS. 5 and 6.

It is advantageous that the transfer and reset gate conductors be composed of polysilicon and a more conductive layer to improve circuit speed by reducing the resistance of the gate conductors. However, if this is not an issue with certain designs and the gate conductor only needs to be a doped polysilicon, then the processing complexity can be reduced. This is accomplished by forming a gate oxide 106, depositing a thin polysilicon layer (50 to 1500 Angstroms) and patterning and etching all gate conductors and specifically the photogate 24, transfer gate 28, and reset gate 32 at the same time. In this simplified process flow there would be insulating sidewall spacers 112 adjacent to the photogate conductor 102 as discussed in more detail below with reference to FIG. 14. In this case the proess is simplified by not requiring a second gate oxide 100 nor a second gate conductor 102 deposition as described earlier.

FIG. 6 depicts an alternate structure for the pixel cell 14 of the first embodiment. This structure has a photogate 24 overlapping the transfer gate 28. When the photogate 24 and transfer gate 28 overlap, no doped region 26 is required for optimal functioning of the pixel.

A second embodiment of the pixel cell 14 is shown in FIG. 7. The pixel cell 14 of the second embodiment is similar in structure to that of the first embodiment, differing only in the structure of the photogate 24. The photogate 24 of the second embodiment is a stacked photogate having two layers: a bottom silicon layer 102 of suitable doped silicon material, such as doped polysilicon, and a top conductive layer 104 of a conductive material transparent to radiant energy, such as indium tin oxide ($In_xSn_yO_z$), indium oxide ($In_2O_3$), or tin oxide ($SnO_2$). The silicon layer 102 has a thickness within the range of 50 to 1500 Angstroms, and is preferably approximately 50 to 800 Angstroms thick. The top conductive layer 104, which is approximately 100 to 3000 Angstroms thick, helps decrease the sheet resistance of the photogate 24 and improves the functioning of the photosensor in applications where sheet resistance is of concern.

Figure 7A:
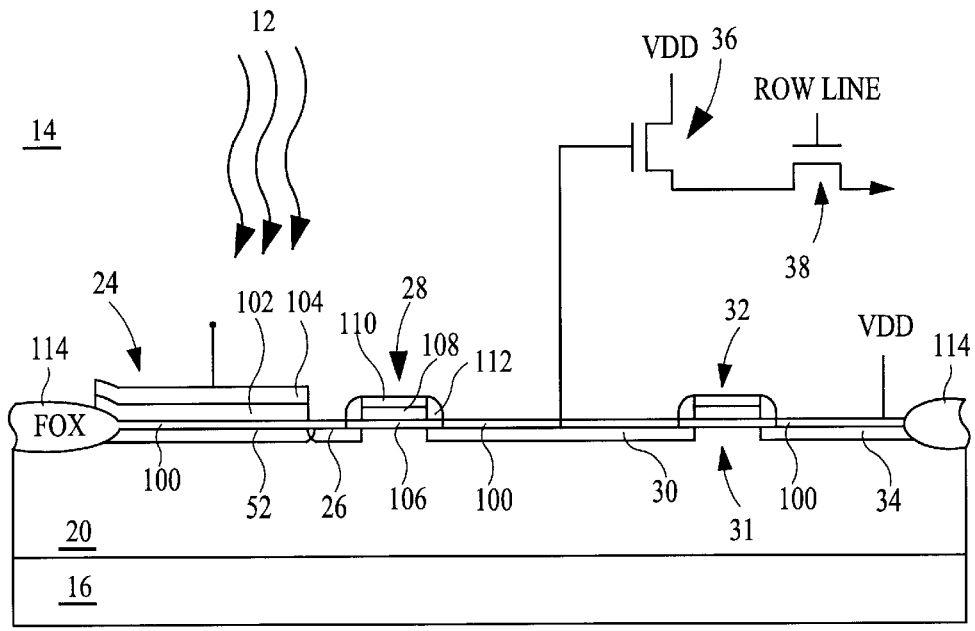
FIGS. 7A and 7B are cross-sectional diagrams showing the pixel sensor of a second embodiment of the invention.
Figure 7B:
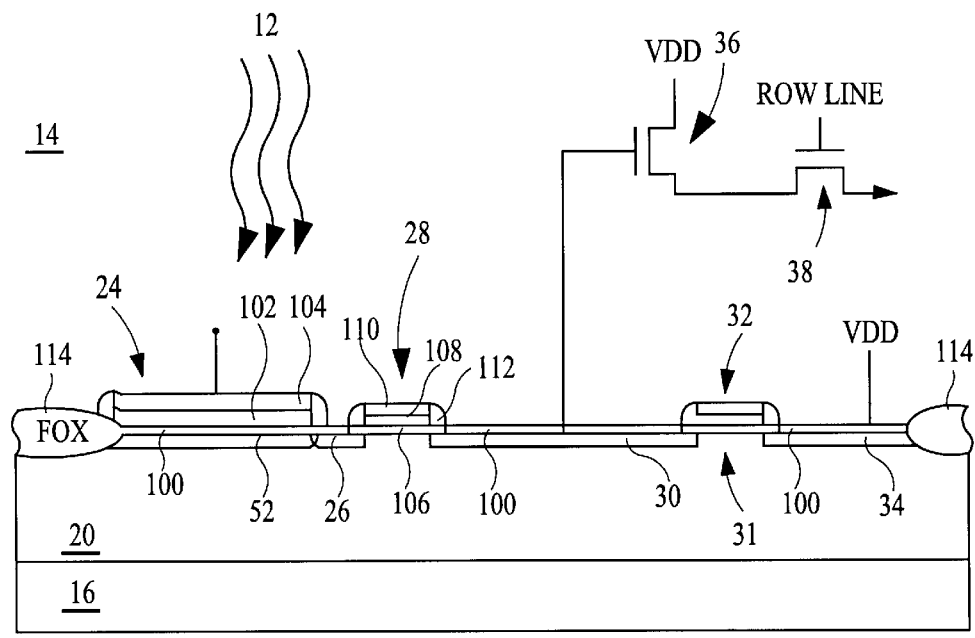

The transparent oxides can be deposited by CVD or sputtering. If by sputtering the oxide may be formed by the sputtering of a metal or an oxide target in an oxygen ambient. To improve the transparency of the transparent conductors (indium oxide, tin oxide, or indium tin oxide), it is advantageous to anneal the film in an oxygen-containing ambient between 200 and 800 degrees Celsius. The ambient can be, for example, gaseous or plasma $O_2$, or gaseous or plasma $O_3$ (ozone). The transfer gate 28 and reset gate 32 may be formed to include the transparent conductive layer 104 on top of the gate conductor 108, as shown in FIG. 7(b), or may be formed without the transparent conductive layer, as is shown in FIG. 7(a).

Figure 8:
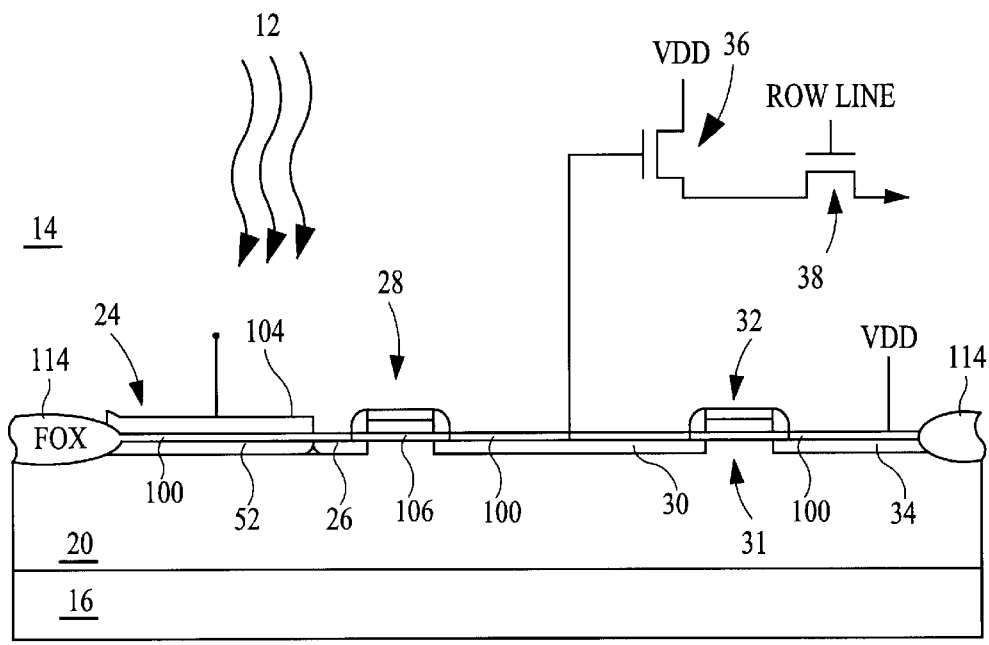
FIG. 8 is a cross-sectional diagram showing the pixel sensor of a third embodiment of the invention.

A third embodiment of the pixel cell 14 is shown in FIG. 8. The pixel cell 14 of the third embodiment is similar in structure to that of the first and second embodiments, differing only in the structure of the photogate 24. The photogate 24 of the third embodiment comprises a thin conductive layer 104 of a material transparent to radiant energy, such as indium tin oxide ($In_xSn_yO_z$), indium oxide ($In_2O_3$), or tin oxide ($SnO_2$). The conductive layer 104 has a thickness within the range of 100 to 3000 Angstroms.

Figure 9:
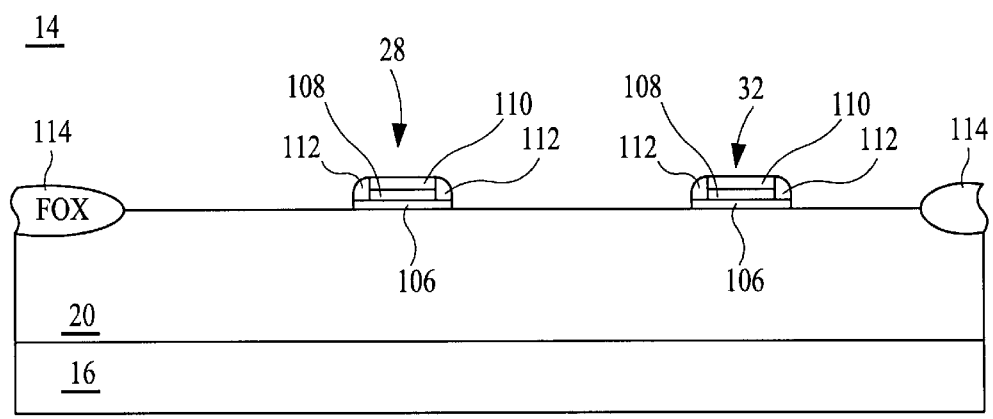
FIG. 9 is a cross-sectional view of a semiconductor wafer undergoing the process of a preferred embodiment of the invention.

The photosensor 24 is manufactured through a process described as follows, and illustrated by FIGS. 9 through 13. Referring now to FIG. 9, a substrate 16, which may be any of the types of substrate described above, is doped to form a doped substrate layer or well 20 of a first conductivity type, which for exemplary purposes will be described as p-type. A field oxide layer 114 is formed around the cell 14 at this time, and is shown in FIG. 9 as residing on a side of the photosite 26 opposite the transfer gate 28, and opposite the reset gate 32. The field oxide layer 114 may be formed by any known technique such as by thermal oxidation of the underlying silicon in a LOCOS process or by etching trenches and filling them with oxide in an STI process.

Second, the reset transistor gate stack 32 and an optional transfer gate stack 28 are formed. These include a gate oxide layer 106 of silicon dioxide or the like on the doped layer 20, and a conductive layer 108 of doped polysilicon, poly/tungsten or poly/barrier metal/tungsten or other suitable material over the gate oxide layer 106. An insulating cap layer 110 of, for example, silicon dioxide, silicon oxynitride, silicon nitride, ON, NO, or ONO (oxide-nitride-oxide) may be formed, if desired. Insulating sidewalls 112 are also formed on the sides of the gate stacks 28, 32. These sidewalls 112 may be formed of, for example, silicon dioxide, silicon nitride, or silicon oxynitride. While these gates may be formed after the process of the present invention described below, for exemplary purposes and for convenience the formation of the photogate will be described as occurring subsequent to gate stack formation.

Figure 10:
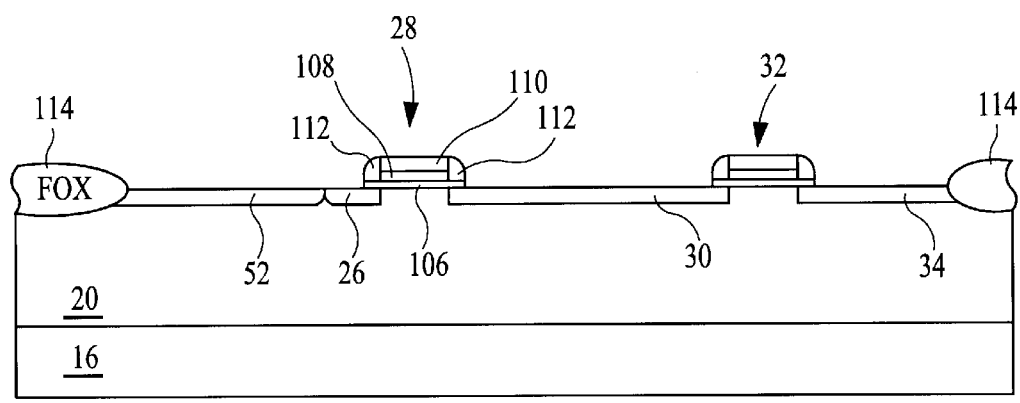
FIG. 10 shows the wafer of FIG. 9 at a processing step subsequent to that shown in FIG. 9.

As shown in FIG. 10, the next step is to form doped regions in the doped substrate layer 20. It should be understood, however, that the substrate layer 20 may be implanted at many different stages of fabrication to achieve the same results. Any suitable doping process, such as ion implantation, may be used. A resist and mask (not shown) are used to shield areas of the layer 20 that are not to be doped. Three doped regions are formed in this step: the photosite 52, the floating diffusion region 30, and a drain region 34. The doped regions 52, 30, 34 are doped to a second conductivity type, which for exemplary purposes will be considered to be n-type. The doping level of the doped regions 52, 30, 34 may vary but should be greater strength than the doping level of the doped layer 20. If desired, multiple masks and resists may be used to dope these regions to different concentrations. Doped region 52 may be variably doped, such as either n+ or n− for an n-channel device. Doped region 34 should be strongly doped, i.e., for an n-channel device, the doped region 34 will be doped as n+. Doped region 30 is typically strongly doped (n+), and would not be lightly doped (n−) unless a buried contact is also used. N-type doped region 26 may be formed at this time or after the photogate 24 is formed.

Figure 11:
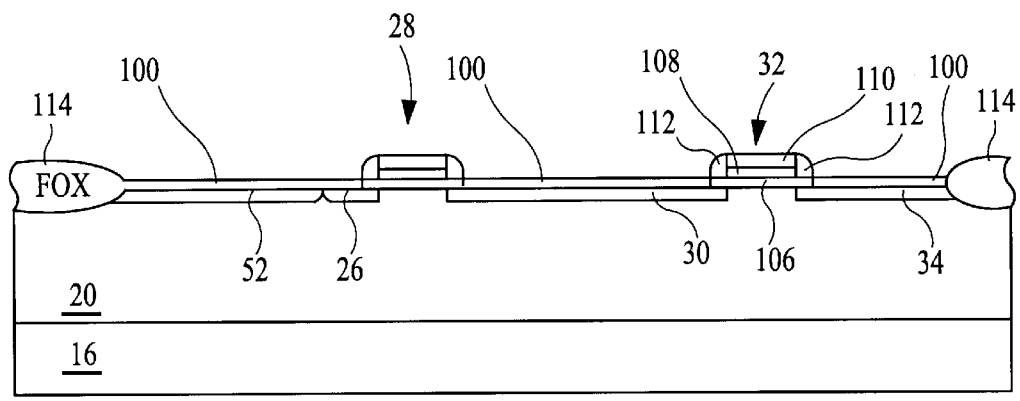
FIG. 11 shows the wafer of FIG. 9 at a processing step subsequent to that shown in FIG. 10.
Figure 12:
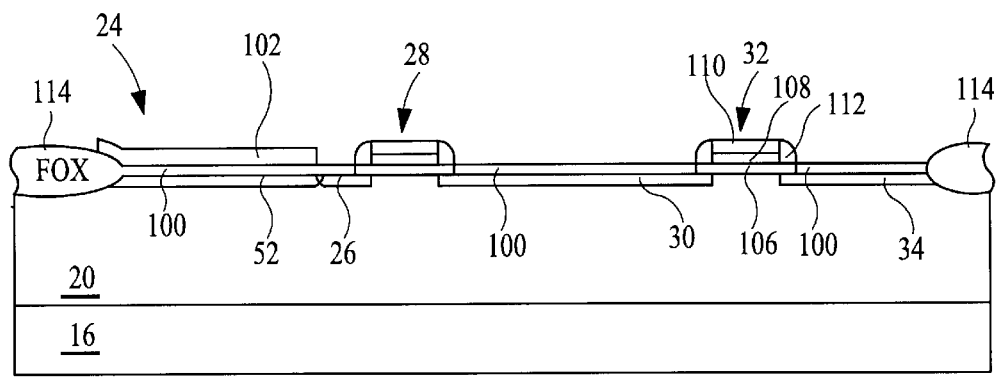
FIG. 12 shows the wafer of FIG. 9 at a processing step subsequent to that shown in FIG. 11.

Referring now to FIG. 11, a gate oxide layer 100 is now formed on top of the photosite 52 by thermal growth of silicon dioxide to a thickness of approximately 3 to 100 nm. As shown in FIG. 12, the next step in the process is to form the photogate 24. For the photosensor of the first embodiment, the photogate 24 is a thin single layer 102 of conductive silicon material that is semi-transparent to electromagnetic radiation of the wavelengths desired to be sensed, such as doped polysilicon. The layer 102 is very thin, i.e., the thickness is within the range of 100 to 1500 Angstroms, and is preferably within the range of 100 to 800 Angstroms, and most preferably is approximately 300 Angstroms. The conductive layer 102 is formed by CVD, or other suitable means, and is formed to cover substantial portions of the gate oxide layer 100, and may extend at least partially over the field oxide layer 114 and may extend over a portion of the transfer gate 28 if there is an insulator 110 over the transistor gate conductor 108 and spacers 112. The photosensor 24 at this stage is shown in FIG. 12. In FIG. 12 we do not show the photogate extending over the transfer gate 28. After the conductive layer 102 is defined an additional masked implant 26 (n-type) may be performed if this implant was not done earlier and if a non-overlapping photogate design is used.

Figure 1:
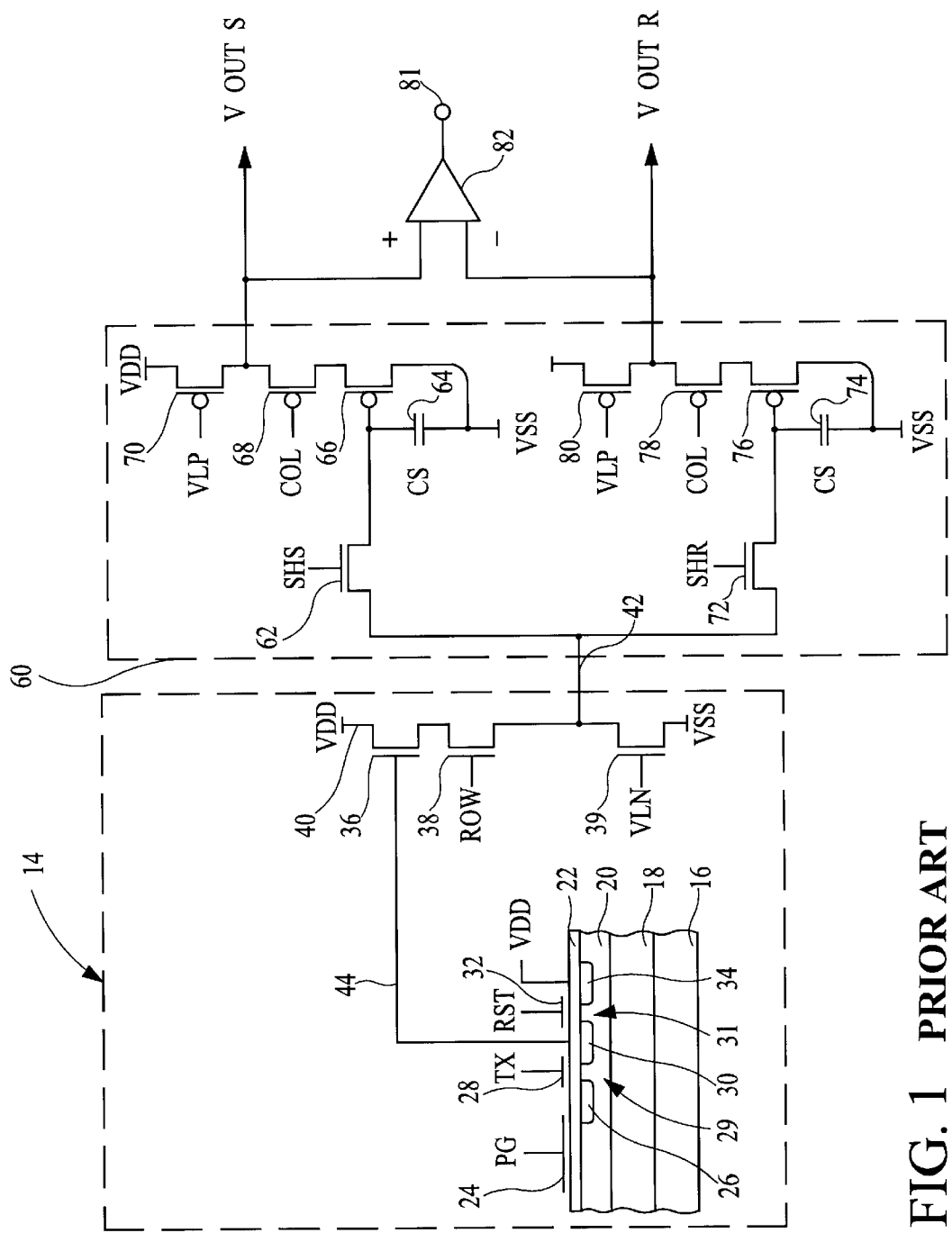
FIG. 1 is a representative circuit of a CMOS imager.
Figure 2:
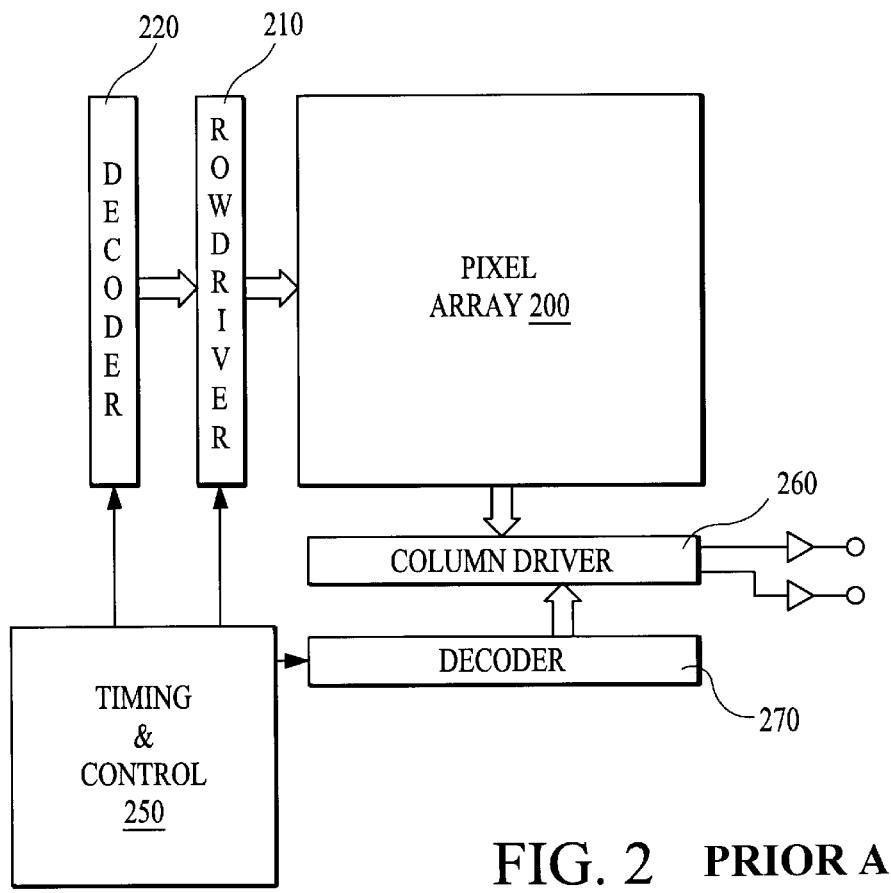
FIG. 2 is a block diagram of a CMOS pixel sensor chip.
Figure 3:
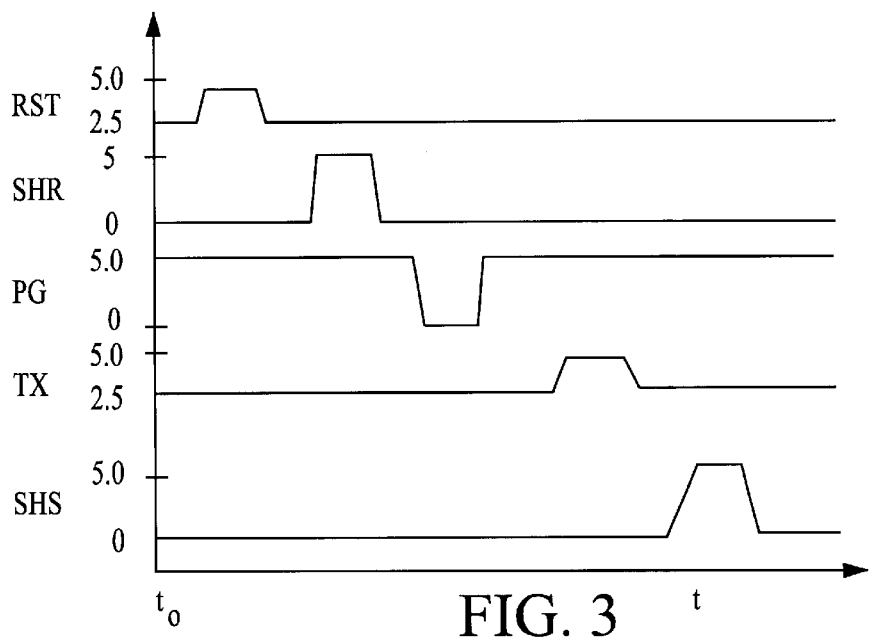
FIG. 3 is a representative timing diagram for the CMOS imager.
Figure 4:
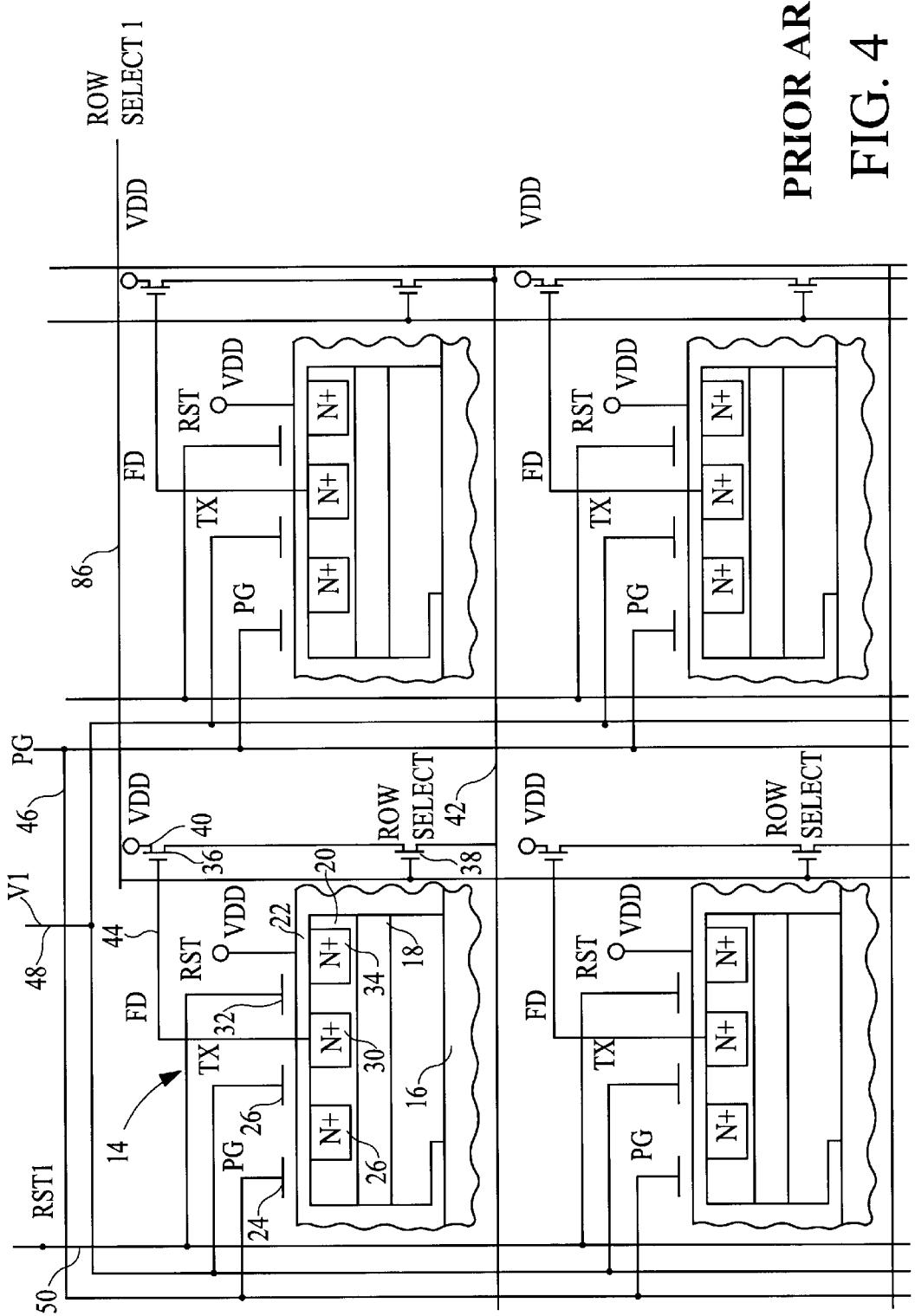
FIG. 4 is a representative pixel layout showing a 2×2 pixel layout.

For the pixel cell 14 of the first embodiment, the photosensor 24 is essentially complete at this stage, and conventional processing methods may then be used to form contacts and wiring to connect gate lines and other connections in the pixel cell 14. For example, the entire surface may then be covered with a passivation layer of, e.g., silicon dioxide, BSG, PSG, or BPSG, which is CMP planarized and etched to provide contact holes, which are then metallized to provide contacts to the photogate, reset gate and transfer gate. Conventional multiple layers of conductors and insulators may also be used to interconnect the structures in the manner shown in FIG. 1.

Figure 13:
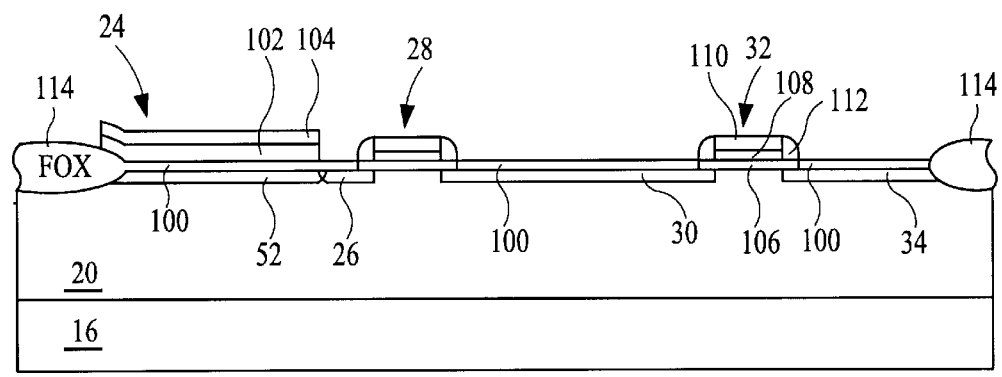
FIG. 13 shows the wafer of FIG. 11 undergoing a processing step according to a second embodiment of the present invention.

The pixel cell 14 of the second embodiment requires further processing steps to form the photogate 24, as shown in FIG. 13. The top conductive layer 104 is formed by CVD or sputtering, or other suitable means, depending on the material of the layer 104. The layer 104 may be any transparent conductive material, such as indium tin oxide, indium oxide, tin oxide, or the like. The top conductive layer 104 is very thin, i.e., the thickness is within the range of 100 to 3000 Angstroms. After deposition of the layer 104, the layers 102 and 104 are patterned to form a stacked photogate 24. Conventional processing methods may then be used to form contacts and wiring to connect gate lines and other connections in the pixel cell 14, as described above.

Figure 14:
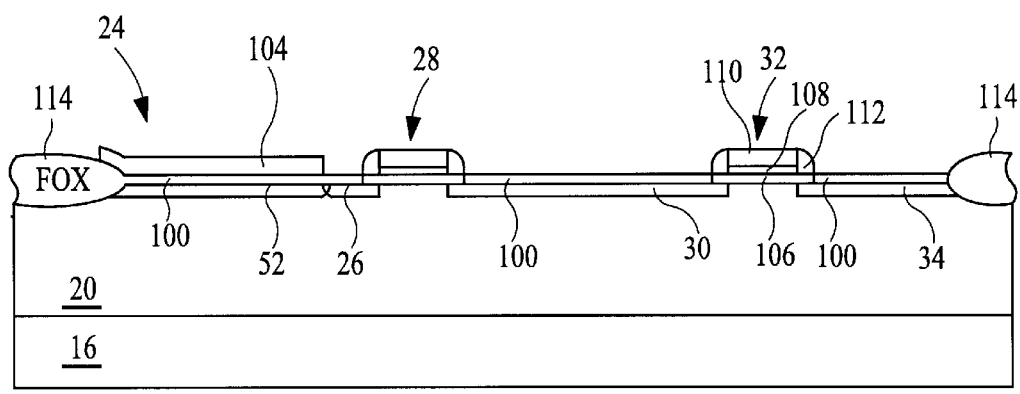
FIG. 14 shows the wafer of FIG. 11 undergoing a processing step according to a third embodiment of the present invention.

The pixel cell 14 of the third embodiment is formed in a fashion similar to that of the first embodiment. After the pixel cell 14 has been processed up through the gate oxide formation depicted in FIG. 11, the next step is to form the photogate, as shown in FIG. 14. The conductive layer 104 is formed by CVD or sputtering, or other suitable means, depending on the material of the layer 104. The layer 104 may be any transparent conductive material, such as indium tin oxide, indium oxide, tin oxide, or the like, and is very thin, i.e., approximately 100 to 3000 Angstroms thick. Conventional processing methods may then be used to form contacts and wiring to connect gate lines and other connections in the pixel cell 14, as described above.

Pixel arrays having the photogates of the present invention, and described with reference to FIGS. 5–12, may be further processed as known in the art to arrive at CMOS imagers having the functions and features of those discussed with reference to FIGS. 1–4.

Figure 15:
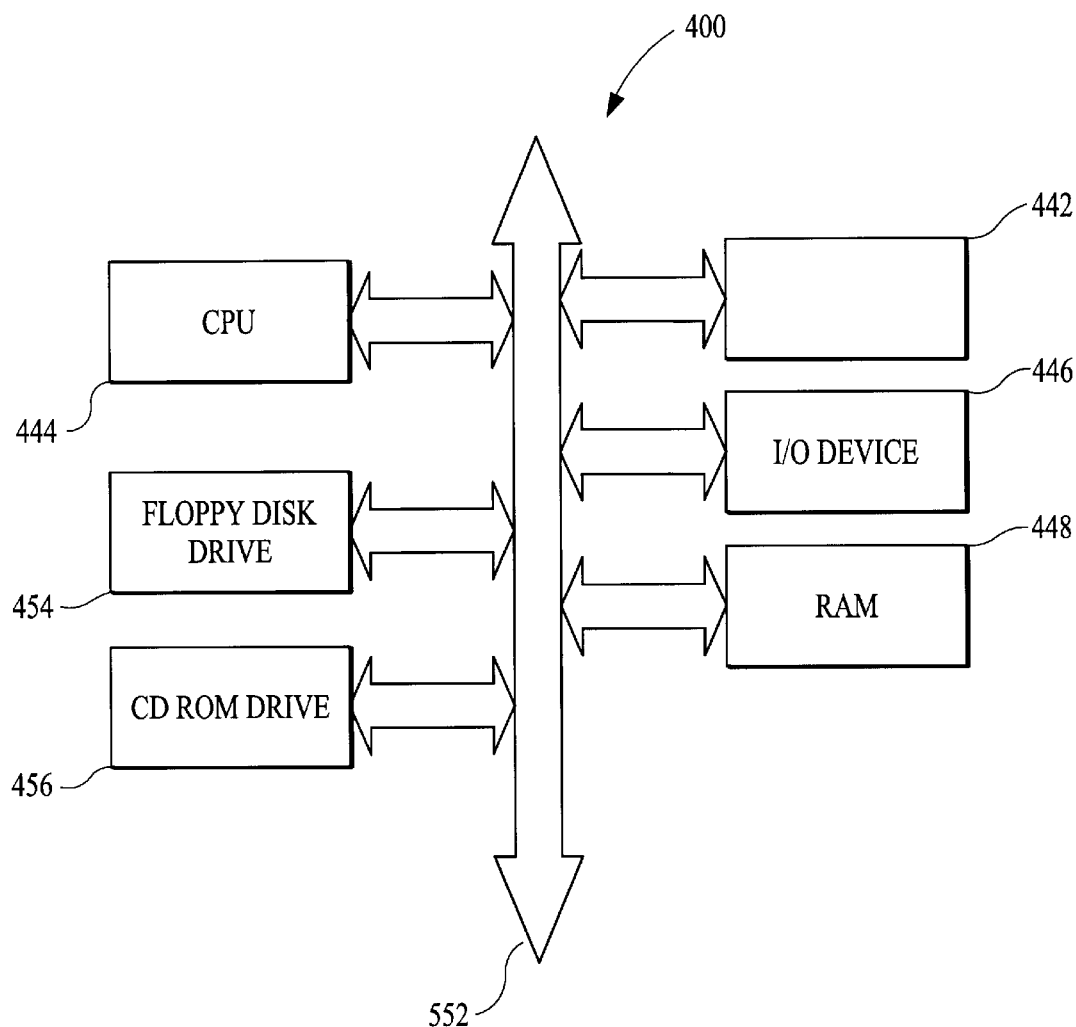
FIG. 15 is an illustration of a computer system having a CMOS imager according to the present invention.

A typical processor based system which includes a CMOS imager device according to the present invention is illustrated generally at 400 in FIG. 15. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 444, e.g., a microprocessor, that communicates with an input/output (I/O) device 446 over a bus 452. The CMOS imager 442 also communicates with the system over bus 452. The processor system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes pixels containing photogate photosensors with very thin conductive layers, as previously described with respect to FIGS. 5 through 14. The CMOS imager 442 may be combined with a processor, such as a CPU, digital signal processor or microprocessor, with or without memory storage, in a single integrated circuit.

As can be seen by the embodiments described herein, the present invention encompasses a photogate photosensor having a very thin conductive layer which exhibits improved short wavelength response. The thinness of the conductive layer permits short wavelength light to pass through more easily, thereby increasing the sensitivity of the photosensor.

It should again be noted that although the invention has been described with specific reference to CMOS imaging circuits having a photogate and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel sensor cell for use in an imaging device, said cell comprising:
   a doped layer formed in a substrate;
   a first doped region formed in said doped layer;
   a stacked photogate provided over said first doped region, said stacked photogate comprising a doped polysilicon layer of a thickness within the range of 50 to 800 Angstroms, and a transparent conductive layer on the doped polysilicon layer, wherein the transparent conductive layer is a layer of material selected from the group consisting of indium tin oxide, indium oxide, and tin oxide;
   a second doped region for receiving image charge transferred from said first doped region;
   a reset transistor for periodically resetting said second doped region to a predetermined potential; and
   an output transistor having a gate electrically connected to the second doped region for providing a signal representing image charge transferred to said second doped region.

2. The pixel sensor cell of claim 1, wherein the doped polysilicon layer has a thickness of approximately 300 Angstroms.

3. The pixel sensor cell of claim 1, wherein the transparent conductive layer is a layer of indium tin oxide.

4. The pixel sensor cell of claim 1, wherein the transparent conductive layer is a layer of indium oxide.

5. The pixel sensor cell of claim 1, wherein the transparent conductive layer is a layer of tin oxide.

6. The pixel sensor cell of claim 1, further comprising a transfer gate located between the first and second doped regions for transferring image charge from said first doped region to said second doped region.

7. The pixel sensor cell of claim 6, wherein the transparent conductive layer extends over a top surface of the transfer gate.

8. The pixel sensor cell of claim 1, wherein the doped layer is doped to a first conductivity type.

9. The pixel sensor cell of claim 8, wherein the first conductivity type is p-type.

10. The pixel sensor cell of claim 1, wherein the first and the second doped regions are doped to a second conductivity type.

11. The pixel sensor cell of claim 10, wherein the second conductivity type is n-type.

12. An array of pixel sensor cells comprising:
    a doped layer formed in a substrate;
    a plurality of pixel sensor cells formed in said doped layer, wherein each pixel sensor cell has a photogate comprising a silicon layer of a thickness within the range of 50 to 800 Angstroms and a transparent conductive layer on the silicon layer, wherein the transparent conductive layer is a layer of material selected from the group consisting of indium tin oxide, indium oxide, and tin oxide.

13. The array of claim 12, wherein the silicon layer is a layer of doped polysilicon.

14. The array of claim 12, wherein the silicon layer has a thickness of approximately 300 Angstroms.

15. The array of claim 12, wherein the transparent conductive layer is a layer of indium tin oxide.

16. The array of claim 12, wherein the transparent conductive layer is a layer of indium oxide.

17. The array of claim 12, wherein the transparent conductive layer is a layer of tin oxide.

18. An imaging system for generating output signals based on an image focused on the imaging system, comprising:
    a plurality of pixel cells arranged into an array of rows and columns, each pixel cell being operable to generate a voltage at a diffusion node corresponding to detected light intensity by the cell, wherein each pixel cell has a photogate comprising a transparent conductive layer of doped polysilicon having a thickness within the range of 50 to 3000 Angstroms, and a transparent oxide layer on the transparent conductive layer, wherein the transparent oxide layer is a layer of material selected from the group consisting of indium tin oxide, indium oxide, and tin oxide;
    a row decoder having a plurality of control lines connected to the cell array, each control line being connected to the cells in a respective row, wherein the row decoder is operable to activate the cells in a row; and
    a plurality of output circuits each including a respective output transistor, each output circuit being connected to a respective cell of said array, each circuit being operable to store voltage signals received from a respective cell and to provide a cell output signal.

19. The imaging system of claim 18, wherein the doped polysilicon layer has a thickness within the range of 50 to 800 Angstroms.

20. The imaging system of claim 18, wherein the transparent oxide layer has a thickness within the range of 100 to 3000 Angstroms.

* * * * *

UNITED STATES PATENT AND TRADEMARK OFFICE
CERTIFICATE OF CORRECTION

PATENT NO. : 6,414,342 B1
DATED : July 2, 2002
INVENTOR(S) : Howard E. Rhodes

It is certified that error appears in the above-identified patent and that said Letters Patent is hereby corrected as shown below:

Column 4,
Line 62, "to" should read -- $t_0$ --.

Signed and Sealed this

Seventh Day of October, 2003

JAMES E. ROGAN
*Director of the United States Patent and Trademark Office*